(12) United States Patent
Nomachi et al.

(10) Patent No.: US 7,541,295 B2
(45) Date of Patent: Jun. 2, 2009

(54) METHOD OF MANUFACTURING SEMICONDUCTOR DEVICE

(75) Inventors: Akiko Nomachi, Yokohama (JP); Hideaki Harakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 235 days.

(21) Appl. No.: 11/589,212

(22) Filed: Oct. 30, 2006

(65) Prior Publication Data

US 2007/0105289 A1 May 10, 2007

(30) Foreign Application Priority Data

Nov. 8, 2005 (JP) ............................. 2005-323849

(51) Int. Cl.
*H01L 21/20* (2006.01)
(52) U.S. Cl. ...................... 438/765; 438/769; 438/770; 438/771; 438/787; 257/E21.209; 257/E21.215; 257/E21.258; 257/E21.546; 257/E21.572
(58) Field of Classification Search ................ 438/233, 438/268, 400, 413, 739, 755, 704, 765, 769, 438/770.771, 787; 257/E21.2, 201, 102, 257/131, 274, 301, 309, 311, 312, 438, 507, 257/E21.209, 215, 218, 285, 546, 572
See application file for complete search history.

(56) References Cited

U.S. PATENT DOCUMENTS 5,989,967 A * 11/1999 Gardner et al. .............. 438/305
6,287,988 B1 * 9/2001 Nagamine et al. ........... 438/770
6,326,281 B1 * 12/2001 Violette et al. .............. 438/413
6,362,086 B2 * 3/2002 Weimer et al. .............. 438/591
6,486,067 B1 * 11/2002 Shen et al. .................. 438/704
2007/0230249 A1 * 10/2007 Miyaki et al. .......... 365/185.22
2007/0252234 A1 * 11/2007 Kawamata et al. .......... 257/506

FOREIGN PATENT DOCUMENTS

JP      11-261062      9/1999

* cited by examiner

*Primary Examiner*—Michael S Lebentritt
(74) *Attorney, Agent, or Firm*—Finnegan, Henderson, Farabow, Garrett & Dunner, L.L.P.

(57) ABSTRACT

A method of manufacturing a semiconductor device according to one aspect of the present invention comprises: forming a gate insulation film on a semiconductor substrate in which element separation regions are formed; depositing a gate lower layer material on the semiconductor substrate via the gate insulation film; depositing a gate upper layer material, which is composed of a material different from the gate lower layer material, on the gate lower layer material; forming a gate comprising a gate upper layer and a gate lower layer by selectively processing the gate upper layer material and the gate lower layer material; increasing the size of the gate upper layer in a horizontal direction with respect to the semiconductor substrate by carrying out a chemical reaction processing treatment to which the gate upper layer has a higher reaction speed than the gate lower layer; forming an impurity implantation region by implanting ions into the semiconductor substrate using the gate upper layer as a mask; and forming a source/drain diffusion layer from the impurity implantation region by carrying out a thermal diffusion treatment.

9 Claims, 6 Drawing Sheets

METHOD OF MANUFACTURING SEMICONDUCTOR DEVICE

CROSS-REFERENCE TO RELATED APPLICATION

This application is based upon and claims the benefit of priority from prior Japanese Patent Application No. 2005-323849 filed on Nov. 8, 2005; the entire contents of which are incorporated herein by reference.

BACKGROUND OF THE INVENTION

1. Field of the Invention

The present invention relates to a method of manufacturing a semiconductor device, and more particularly, to a method of forming a source/drain diffusion layer making use of a MOSFET gate structure.

2. Related Background Art

In a conventional MOSFET manufacturing technology, to provide an offset distance between a gate and a soured/drain diffusion layer, there is employed a technology for forming a side wall to the gate and forming the source/drain diffusion layer by implanting ions into the side wall in a self-aligning manner.

The side wall of the gate is used for the purpose of reducing a short channel effect by forming an offset distance in a horizontal direction with respect to the surface of a substrate between the source/drain diffusion layer as an impurity implantation region and a channel region (channel inversion layer) under the gate.

However, when anisotropic etching is carried out to form the side wall of the gate, the substrate is retracted, that is, the substrate is overetched vertically downward with respect to the surface of substrate. The source/drain diffusion layer acting as the impurity diffusion layer and formed on the retracted surface portion of the substrate is spaced apart from the channel inversion layer formed on the not-retracted surface portion of the substrate under the gate by the amount of retraction of the substrate in a vertical direction with respect to the surface of the substrate, so that parasitic resistance is generated.

A larger amount of retraction of the substrate results in a longer distance between the source/drain diffusion layer and the channel inversion layer. Since the path between the source/drain diffusion layer and the channel inversion layer acts as parasitic capacitance when an element operates, an increase of the distance between the source/drain diffusion layer and the channel inversion layer causes a problem of reduction of a transistor drive current.

Accordingly, there is required a method of manufacturing a semiconductor device that can avoid an increase of parasitic capacitance due to separation of source/drain diffusion layer from a channel inversion layer while providing an offset distance between a gate and the source/drain diffusion layer.

Note that countermeasures for improving a MOSFET manufacturing method for forming source/drain diffusion layer by a self-aligning method using a side wall of a gate have been proposed up to now and commonly known. As to these countermeasures, refer to, for example, Japanese Patent Laid-Open Publication No. 11-261062 (261062/1999).

However, the MOSFET manufacturing method disclosed in the above publication exclusively aims to reduce a manufacturing process and does not aim to solve the above problem.

SUMMARY OF THE INVENTION

According to one aspect of the present invention, there is provided a method of manufacturing a semiconductor device comprising:

forming a gate insulation film on a semiconductor substrate in which element separation regions are formed;

depositing a gate lower layer material on the semiconductor substrate via the gate insulation film;

depositing a gate upper layer material, which is composed of a material different from the gate lower layer material, on the gate lower layer material;

forming a gate comprising a gate upper layer and a gate lower layer by selectively processing the gate upper layer material and the gate lower layer material;

increasing the size of the gate upper layer in a horizontal direction with respect to the semiconductor substrate by carrying out a chemical reaction processing treatment to which the gate upper layer has a higher reaction speed than the gate lower layer;

forming an impurity implantation region by implanting ions into the semiconductor substrate using the gate upper layer as a mask; and forming a source/drain diffusion layer from the impurity implantation region by carrying out a thermal diffusion treatment.

According to another aspect of the present invention, there is provided a method of manufacturing a semiconductor device comprising:

forming a gate insulation film on a semiconductor substrate in which element separation regions are formed;

depositing a gate lower layer material on the semiconductor substrate via the gate insulation film;

depositing a gate upper layer material, which comprises a material different from the gate lower layer material, on the gate lower layer material;

forming a gate comprising a gate upper layer and a gate lower layer by selectively processing the gate upper layer material and the gate lower layer material;

forming gate side walls on the side surface portions of the gate;

forming a first impurity implantation region by implanting ions into the semiconductor substrate using the gate side walls as a mask;

forming a source/drain diffusion layer from the first impurity implantation region by carrying out a thermal diffusion treatment;

removing the gate sides walls, and thereafter increasing the size of the gate upper layer in a horizontal direction with respect to the semiconductor substrate by carrying out a chemical reaction processing treatment to which the gate upper layer has a higher reaction speed than the gate lower layer;

forming a second impurity implantation region by implanting ions into the semiconductor substrate using the gate upper layer as a mask; and forming an extension region diffusion layer from the second impurity implantation region by carrying out a thermal diffusion treatment.

DETAILED DESCRIPTION OF THE EMBODIMENTS

In an embodiment of the present invention, a gate is formed by a laminated structure in which an upper layer is deposited on a silicon layer, wherein the upper layer is composed of any of materials that can be oxidized at a temperature lower than silicon, for example, tungsten (W), titanium (Ti), zirconium (Zr), hafnium (Hf), tantalum (Ta) and nitrides of these metals. Thereafter, only a gate upper layer can be oxidized without almost oxidizing the silicon layer by carrying out a thermal oxidation treatment in an oxidizing atmosphere by setting a temperature condition to a temperature lower than the thermal oxidation treatment temperature of silicon, for example, 400 to 600° C.

Since the volume of a gate upper layer composed of tungsten (W) as an example is increased by oxidation, it is possible to form a gate structure in which the width of a gate upper layer is larger than the width of a gate lower silicon layer by carrying out a heat treatment process by employing a gate having a laminated structure as described above. A sufficient offset distance, which is as large as the difference between the width of the gate upper layer and the width of the gate lower silicon layer and is similar to that obtained by a conventional technology, can be provided between a channel region and source/drain diffusion layer by carrying out ion implantation by a self-aligning method masking use of the gate structure in which only the width of the gate upper layer is increased.

In contrast, in the embodiment of the present invention, a substrate is not retracted in source/drain diffusion layer forming region different from the conventional technology using a gate side wall.

Accordingly, the parasitic capacitance between the source/drain diffusion layer and a channel inversion layer can be more reduced than that of the conventional technology.

Embodiments of a method of manufacturing a semiconductor device according to the present invention will be explained below in detail with reference to the figures by exemplifying specific examples.

Figure 1:
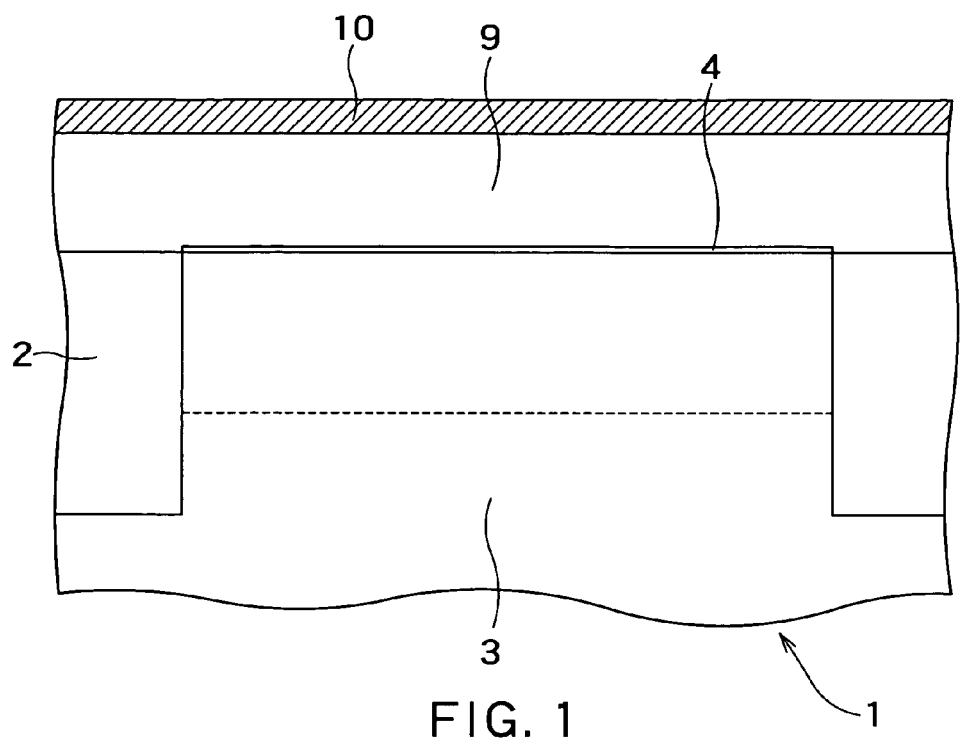
FIGS. 1 to 5 are sectional views showing a sectional structure in a manufacturing process of a method of manufacturing a semiconductor device according to a first embodiment of the present invention.
Figure 2:
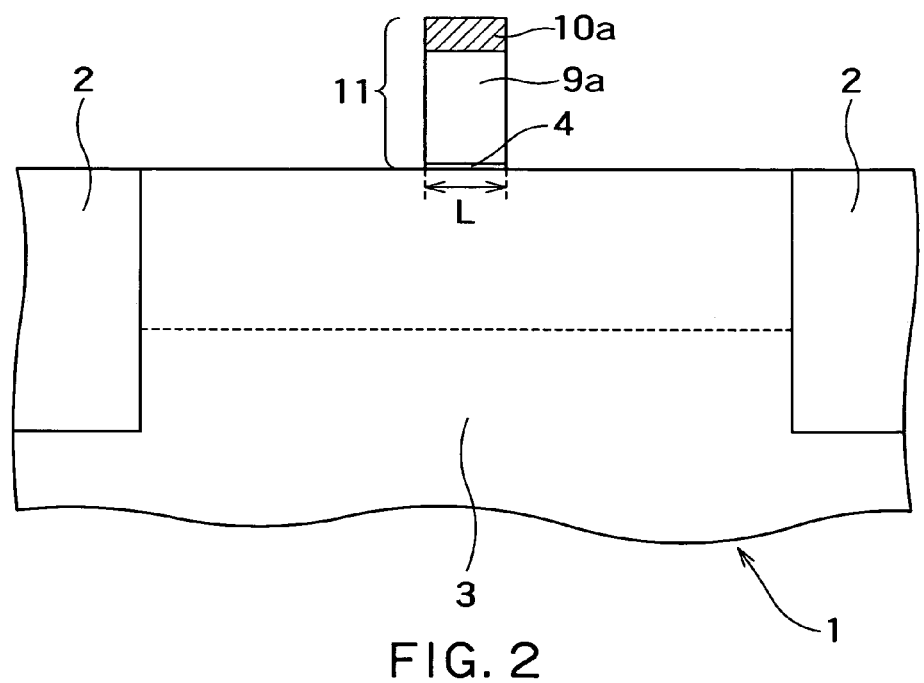
Figure 3:
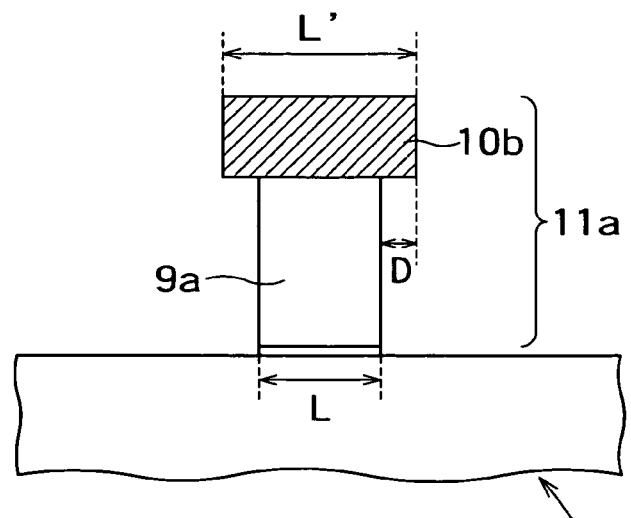
Figure 4:
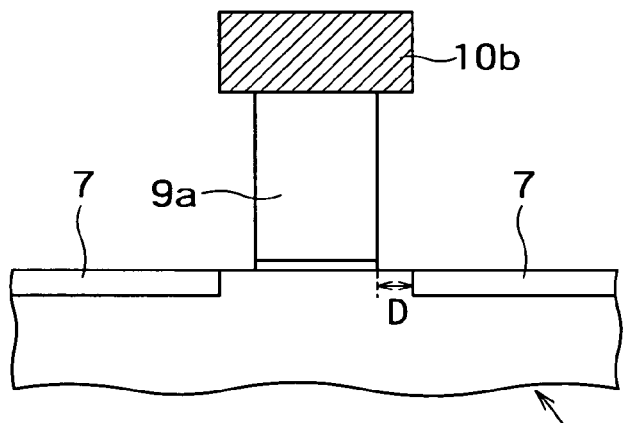
Figure 5:
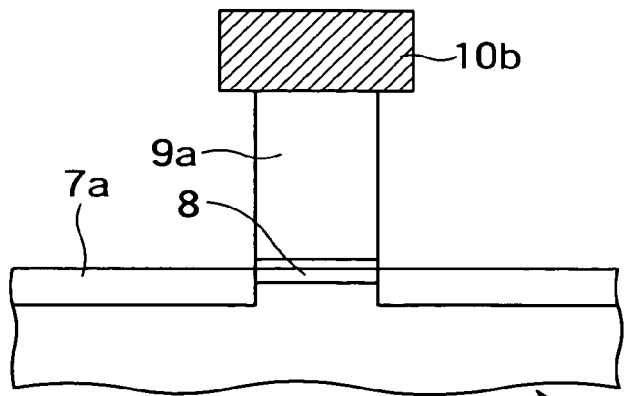

FIGS. 1 to 5 are sectional views showing a sectional structure in a manufacturing process of a method of manufacturing a semiconductor device according to a first embodiment of the present invention. Note that FIGS. 3 to 5 show only a structure in the periphery of a gate omitting an element separation region.

As shown in FIG. 1, first, element separation regions 2 are selectively formed on the surface portion of a silicon substrate 1, a well diffusion layer 3 is formed to a portion having a predetermined depth in an element region defined by the element separation regions 2, and further a gate insulation film 4 is formed on the surface of the silicon substrate 1.

After the gate insulation film 4 is formed, polysilicon is deposited to a thickness of, for example, 100 nm as a gate lower layer material 9, and tungsten (W) is deposited in this case on the gate lower layer material 9 to a thickness of, for example, 30 nm as a gate upper layer material 10.

Then, the gate lower layer material 9 and the gate upper layer material 10 are selectively etched using a lithography technique, so that a gate 11 composed a two-layer structure including a gate lower layer 9a and a gate upper layer 10a is formed as shown in FIG. 2. At the same time, the gate insulation film 4 in the portion other than the region in which the gate 11 is formed is also removed. Note that, as apparent from the above materials, the gate lower layer 9a is composed of polysilicon, and the gate upper layer 10a is formed of tungsten in this case.

Thereafter, as shown in FIG. 3, a gate upper layer 10b composed of tungsten oxide can be formed by sufficiently oxidizing only the gate upper layer 10a composed of tungsten without almost oxidizing silicon substrate 1 and the gate lower layer 9a by carrying out annealing in an oxidizing atmosphere by setting a temperature condition to a temperature lower than the thermal oxidization treatment temperature of the material of the gate lower layer 9a, that is, the thermal oxidization treatment temperature of silicon in this case, for example, 600° C. or less, and more specifically 400 to 600° C. In other words, in the process, a chemical reaction processing treatment, in which the gate upper layer 10a has a reaction speed higher than that of the silicon substrate 1 and the gate lower layer 9a, is carried out.

When tungsten is oxidized and made to tungsten oxide, the volume of it is increased to about three times as large as its original volume. That is, the gate upper layer 10b composed of tungsten oxide has a volume three times as large as its original volume in comparison with the gate upper layer 10a composed of original tungsten.

In contrast, since the gate lower layer 9a composed of polysilicon is not almost oxidized, its volume is not almost changed too. At the time, the surface of the silicon substrate 1 is not also almost oxidized.

Accordingly, as shown in FIG. 3, the size L' of the gate upper layer 10b is made larger than the size L of the gate lower layer 9a, that is, a gate length L, so that an inequality L'>L is established. When, for example, the gate length L is about 30 nm, the size of the gate upper layer 10b composed of tungsten oxide is about 43 nm.

As a result, a gate 11a, which is composed of the gate lower layer 9a and the gate upper layer 10b whose size is larger than the gate lower layer 9a, is formed.

After the gate structure in which only the upper layer has the large size is obtained, ion implantation is carried out in the self-aligning method using the gate upper layer 10b as a mask as shown in FIG. 4. At the time, no ion implantation is carried out to the region of the silicon substrate 1 corresponding to the portion of the gate upper layer 10b projecting in a horizontal direction with respect to the gate lower layer 9a. That is, the region, to which the ion implantation is carried out, is the region outside of the position spaced apart from the gate lower layer 9a by a distance D corresponding to the size of the projecting portion of the gate upper layer 10b. When the gate length L is about 30 nm and the size of the gate upper layer 10b is about 43 nm, the value of the distance D is about $D=(L'-L)/2=6.5$ nm.

As described above, in the first embodiment of the present invention, the ion implantation region can be set to the region spaced apart from the gate lower layer 9a by the distance D by carrying out the ion implantation by the self-aligning method using the gate upper layer 10b as the mask. Accordingly, a short channel effect can be reduced by providing an offset distance between the source/drain diffusion layer and the channel region (channel inversion layer) under the gate in the horizontal direction with respect to the surface of the substrate.

On the other hand, in the first embodiment of the present invention, since no gate side wall is formed different from the conventional manufacturing method, a problem does not occur in that the substrate is retracted by processing the gate side wall, that is, the substrate is not overetched horizontally downward with respect to the surface of the substrate. Thus, since the source/drain diffusion layer is not spaced apart from the channel inversion layer in a vertically direction with respect to the surface of the substrate, an increase of parasitic capacitance between the source/drain diffusion layer and the channel inversion layer can be avoided, and the amount of the parasitic capacitance can be more reduced than that of the conventional technology.

After the ion implantation is carried out, the impurity implantation region, into which ions are implanted, is activated as shown in FIG. 5 by carrying out a thermal diffusion treatment, so that source/drain diffusion layer 7a is formed. Since the substrate is not retracted different from the case in which the gate side wall is processed, it can be found that the distance between the maximum density portion of the source/drain diffusion layer and the channel inversion layer is not increased and a minimum distance is established between them according to the depth of the maximum density portion of the source/drain diffusion layer.

Since the distance between the maximum density portion of the source/drain diffusion layer and the channel inversion layer is reflected to the magnitude of parasitic resistance when the element operates, the parasitic resistance is suppressed by the arrangement of the first embodiment of the present invention. As a result, a drive current of a transistor can be more increased than a conventional arrangement.

In the example described above, polysilicon (poly-Si) is used as the material of the gate lower layer 9a, tungsten (W) is used as the material of the gate upper layer 10a, and the gate upper layer 10b composed of tungsten oxide can be obtained by the thermal oxidization. However, any arbitrary combination of materials of the gate upper layer and the gate lower layer may be employed as long as the size of the gate upper layer can be made larger than that of the gate lower layer in the horizontal direction with respect to the surface of the substrate by the combination of the materials, and any arbitrary kind of treatment and any arbitrary kind of chemical reaction may be employed to increase the size of the gate upper layer. For example, the material of the gate upper layer 10a may be any of titanium (Ti), zirconium (Zr), hafnium (Hf), tantalum (Ta) and nitrides of these metals, in addition to tungsten (W). Further, both the materials of the gate upper layer and the gate lower layer may be metal, and a nitriding reaction may be employed to the gate upper layer in place of an oxidizing reaction.

As described above, according to the one embodiment of the present invention, there can be provided the method of manufacturing the semiconductor device that can avoid the increase of the parasitic capacitance due to separation of the source/drain diffusion layer from the channel inversion layer while providing the offset distance between the gate and the source/drain diffusion layer.

Next, an overall structure of a semiconductor device including the gate peripheral structure according to the first embodiment of the present invention described above and a manufacturing process of the semiconductor device will be explained as a semiconductor device and a method of manufacturing the same according to a second embodiment of the present invention.

FIGS. 6 to 13 are sectional views showing a sectional structure in a manufacturing process of a method of manufacturing a semiconductor device according to the second embodiment of the present invention.

The initial portion of the manufacturing processes of the method of manufacturing the semiconductor device according to the second embodiment of the present invention is the same as that of the manufacturing process of the method of manufacturing the semiconductor device according to the first embodiment of the present invention, that is, the same as the manufacturing processes shown in FIGS. 1 and 2. First, a gate 11 is formed in which a gate lower layer 9a composed of polysilicon as an example of a material and a gate upper layer 10a composed of tungsten as an example of a material are laminated on a gate insulation film 4.

Note that, as described above, the gate insulation film 4 is formed on the surface of a silicon substrate 1, and the silicon substrate 1 has a well diffusion layer 3 formed to it in an element region with a predetermined depth partitioned by element separation regions 2.

Figure 6:
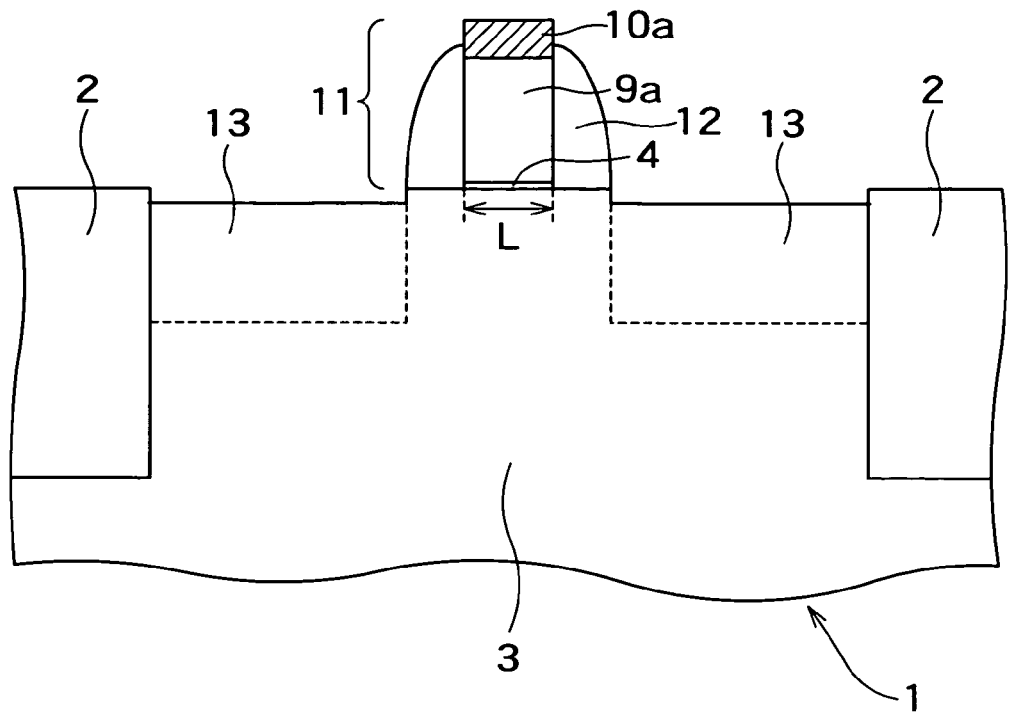
FIGS. 6 to 13 are sectional views showing a sectional structure in a manufacturing process of a method of manufacturing a semiconductor device according to a second embodiment of the present invention.

After the gate 11 composed of a two-layer structure including the gate lower layer 9a and the gate upper layer 10a is formed, gate side walls 12 are formed on both the side surfaces of the gate 11 as shown in FIG. 6. The width of the gate side walls 12 is set to, for example, 50 nm from the side surfaces of the gate 11. The gate side walls 12 are formed by reactive ion etching (RIE), and the surface portion of the silicon substrate 1 is overetched at the time. As a result, the surface of the silicon substrate 1 is retracted in the region of it that is not covered with the gate 11 and the gate side walls 12, that is, the position of the surface of the silicon substrate 1 is lowered in the above region.

After the gate side walls 12 are formed, a source/drain diffusion layer 13 is formed by implanting ions by a self-aligning method making use of the gate side walls 12.

Figure 7:
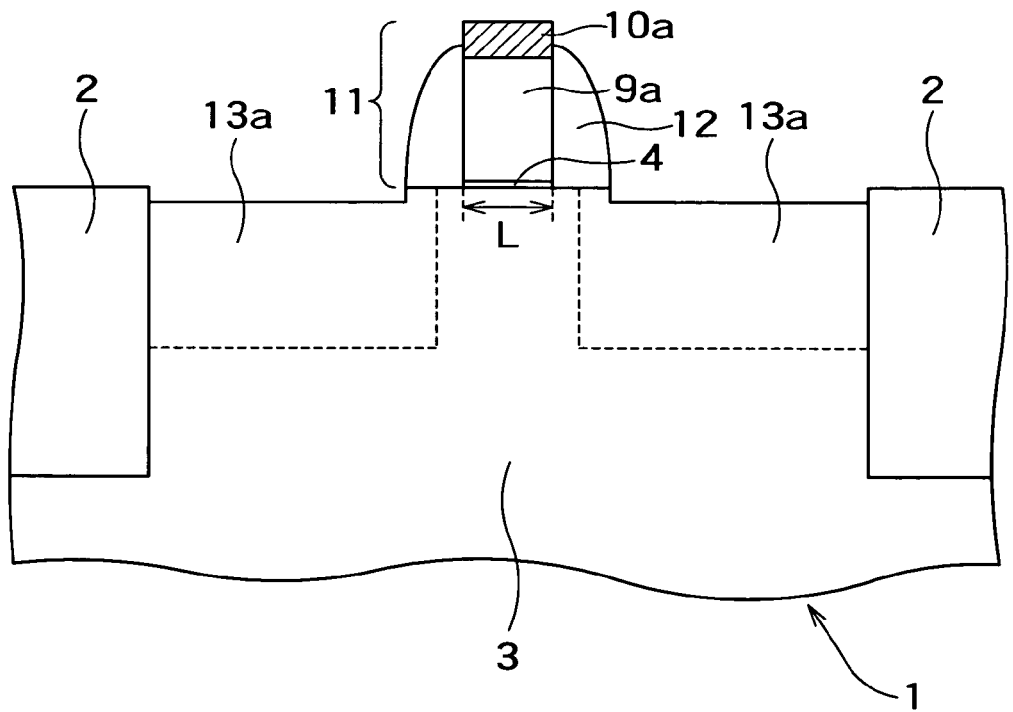

When the source/drain diffusion layer 13 is thermally activated after it is formed, the impurities implanted into the source/drain diffusion layer 13 are thermally diffused, so that the source/drain diffusion layer 13 is made to a source/drain diffusion layer 13a diffused in a horizontal direction and a vertical direction as shown in FIG. 7.

Figure 8:
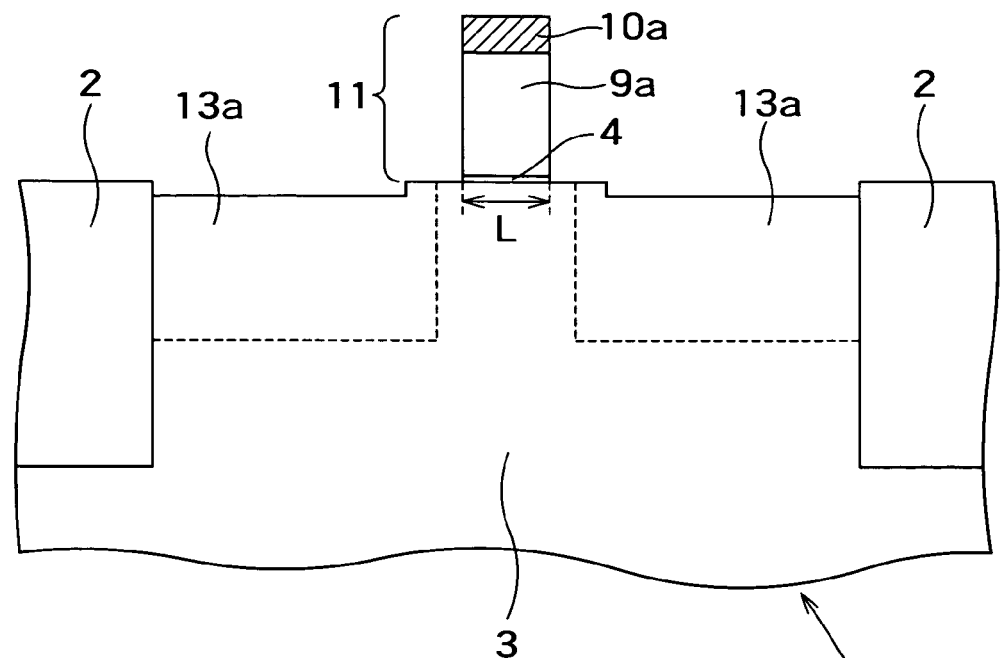

After the source/drain diffusion layer 13a is formed by the thermal diffusion, the gate side walls 12 are removed by etching as shown in FIG. 8.

Figure 9:
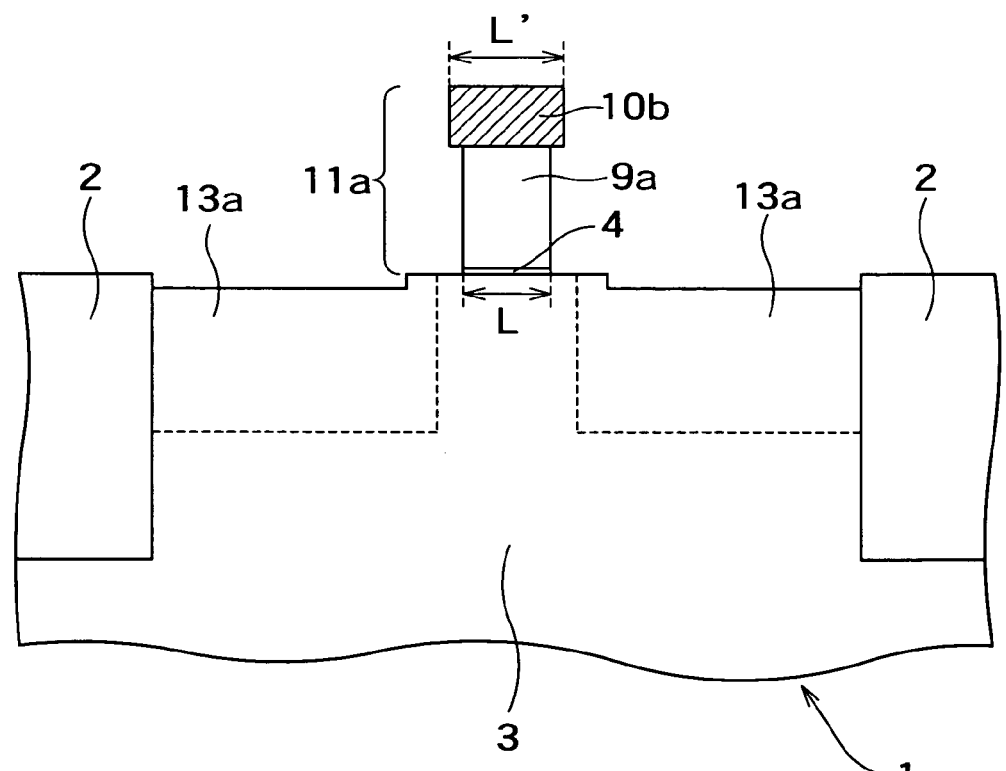

Thereafter, as shown in FIG. 9, a gate upper layer 10b composed of tungsten oxide can be formed by sufficiently oxidizing only the gate upper layer 10a composed of tungsten without almost oxidizing silicon substrate 1 and the gate lower layer 9a by carrying out annealing in an oxidizing atmosphere by setting a temperature condition to a temperature lower than the thermal oxidization treatment temperature of the material of the gate lower layer 9a, that is, the thermal oxidization treatment temperature of silicon in this case, for example, 600° C. or less, and more specifically 400 to 600° C. In other words, in the process, a chemical reaction processing treatment, in which the gate upper layer 10a has a reaction speed higher than that of the silicon substrate 1 and the gate lower layer 9a, is carried out.

As described above in the first embodiment of the present invention, when tungsten is oxidized and made to tungsten oxide, the volume of it is increased to about three times as large as its original volume. That is, the gate upper layer 10b composed of tungsten oxide has a volume three times as large as its original volume in comparison with the gate upper layer 10a composed of original tungsten.

In contrast, since the gate lower layer 9a composed of polysilicon is not almost oxidized, its volume is not almost changed too. At the time, the surface of the silicon substrate 1 is not also almost oxidized.

Accordingly, as shown in FIG. 9, the size L' of the gate upper layer 10b is made larger than the size L of the gate lower layer 9a, that is, a gate length L, so that an inequality L'>L is established. When, for example, the gate length L is about 30 nm, the size of the gate upper layer 10b composed of tungsten oxide is about 43 nm.

As a result, a gate 11a, which is composed of the gate lower layer 9a and the gate upper layer 10b whose size is larger than the gate lower layer 9a, is formed.

Figure 10:
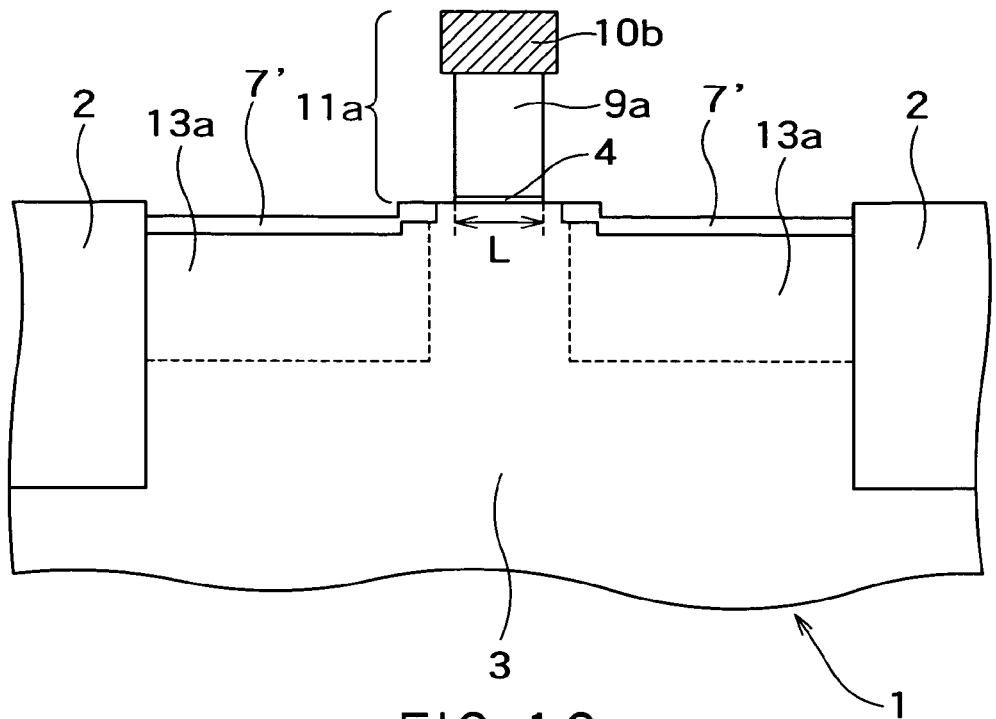

After the gate structure in which only the upper layer has the large size is obtained, ion implantation is carried out in the self-aligning method using the gate upper layer 10b as a mask as shown in FIG. 10. At the time, no ion implantation is carried out to the region of the silicon substrate 1 corresponding to the portion of the gate upper layer 10b projecting in a horizontal direction with respect to the gate lower layer 9a. That is, the region, to which the ion implantation is carried out, is the region outside of the position spaced apart from the gate lower layer 9a by a distance D corresponding to the size of the projecting portion of the gate upper layer 10b. When the gate length L is about 30 nm and the size of the gate upper layer 10b is about 43 nm, the value of the distance D is about $D=(L'-L)/2=6.5$ nm.

Since a diffusion layer 7' is formed by the ion implantation so as to have a density lower than that of the source/drain diffusion layer 13a and so as to be shallower than the layer 13a, the diffusion layer 7' is an extension region diffusion layer of a so-called LDD (lightly doped drain) structure.

As described above, also in the second embodiment of the present invention as well as the first embodiment of the present invention, the ion implantation region can be set to the region spaced apart from the gate lower layer 9a by the distance D by carrying out the ion implantation by the self-aligning method using the gate upper layer 10b as the mask. Accordingly, a short channel effect can be reduced by providing an offset distance between the source/drain diffusion layer and the channel region (channel inversion layer) under the gate in the horizontal direction with respect to the surface of the substrate.

In the second embodiment of the present invention, the gate side walls 12 are formed when ions are implanted to form the source/drain diffusion layer 13. However, since no gate side wall is formed when ions are implanted to form the extension region diffusion layer 7', the substrate can be prevented from being retracted when the gate side walls are processed, that is, the substrate can be prevented from being further overetched vertically downward with respect to the surface of the substrate.

Thus, since the source/drain diffusion layer is not spaced apart from the channel inversion layer in the vertically direction with respect to the surface of the substrate, the increase of the parasitic capacitance between the source/drain diffusion layer and the channel inversion layer can be avoided. Accordingly, the amount of the parasitic capacitance can be reduced as compared with the conventional technology.

Figure 11:
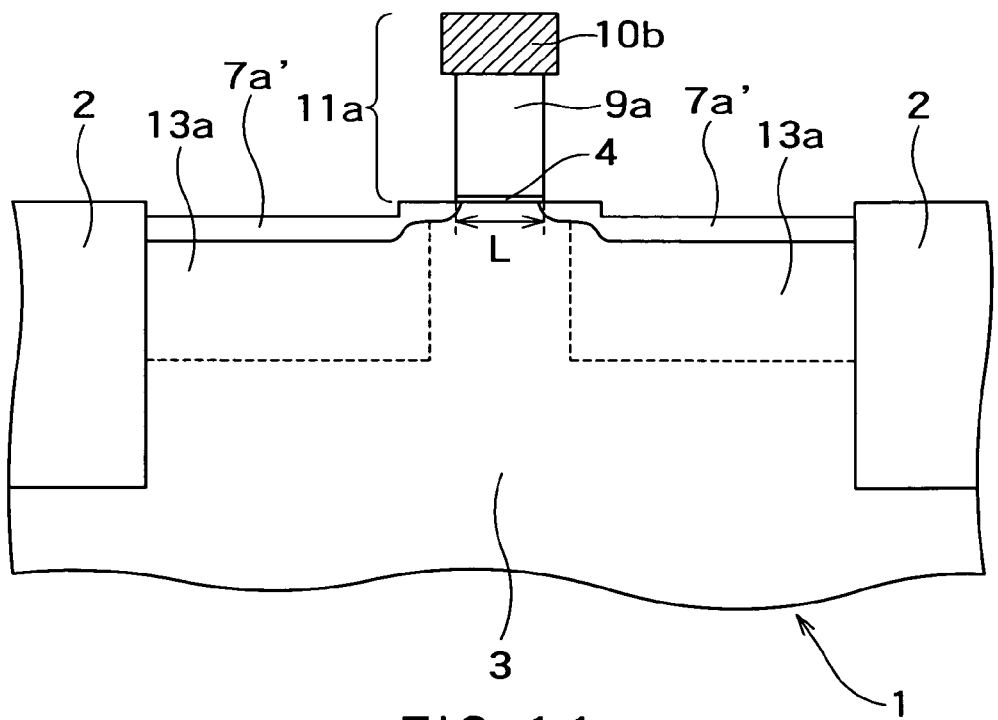

When the extension region diffusion layer 7' is thermally activated after it is formed, the impurities implanted into the diffusion layer 7' are thermally diffused, so that the extension region diffusion layer 7' is made to an extension region diffusion layer 7a' diffused in the horizontal direction and the vertical direction as shown in FIG. 11.

Figure 12:
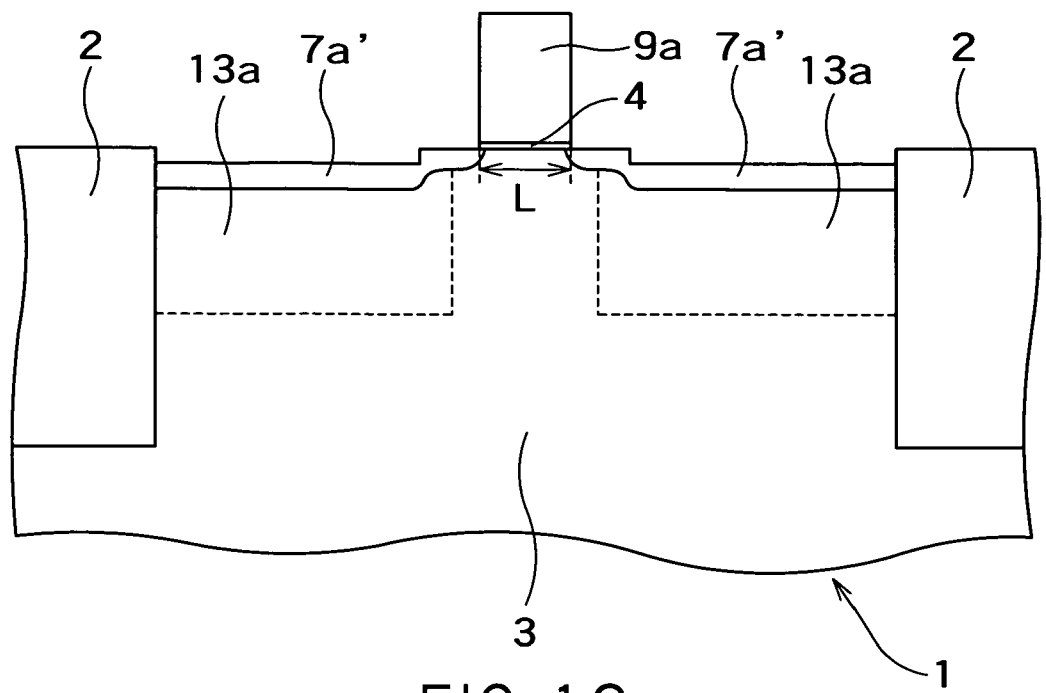

After the extension region diffusion layer 7a' is formed by the thermal diffusion, the gate upper layer 10b of the gate 11 is removed, and the upper surface of the gate lower layer 9a is exposed as shown in FIG. 12.

Figure 13:
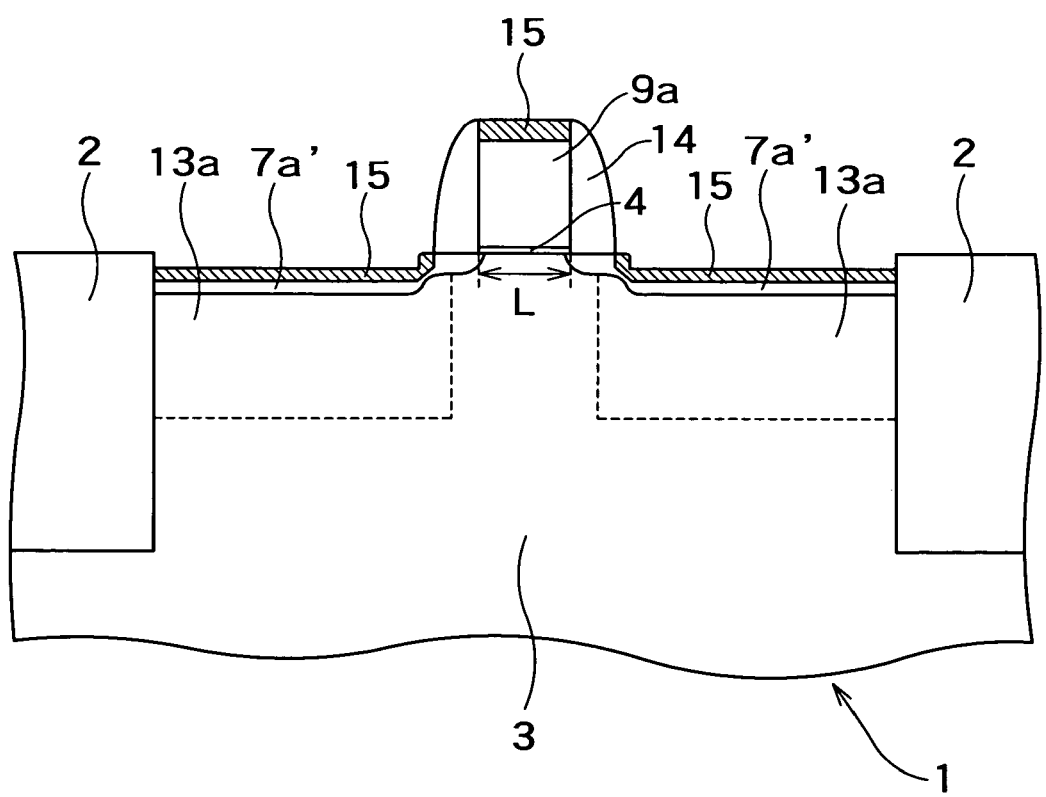

After the gate upper layer 10b is removed, gate side wall insulation films 14 are formed on both the side surface portions of the gate lower layer 9a as shown in FIG. 13. The width of the gate side walls 14 is set to, for example, 40 nm from the side surface of the gate lower layer 9a. Self-alignment silicidation is further carried out to the structure, so that a nickel (Ni) silicide 15 is formed onto the exposed surface portion of the extension region diffusion layer 7a' and the upper surface portion of the gate lower layer 9a. That is, a reason why the gate upper layer 10b is removed is to reduce resistance by forming the nickel (Ni) silicide also onto the upper portion of a gate wiring, and a reason why the gate side wall insulation films 14 are formed is to prevent short circuit between the gate (gate lower layer 9a and the nickel silicide 15) and the silicon substrate 1.

In the structure according to the second embodiment of the present invention, the substrate is retracted only when the gate side walls 12 and the gate side wall insulation films 14 are formed. However, since the resistance is reduced by forming the nickel silicide, the amount of retraction of the substrate is not a problem.

In the conventional technology, the substrate is retracted also in the process of forming side walls to form the extension region. Since no nickel silicide is formed to a retracted portion in the conventional technology, the retracted surface of the substrate directly increases parasitic resistance.

In contrast, in the structure according to the semiconductor device and the method of manufacturing the same according to the second embodiment of the present invention, since the corresponding retraction of the substrate is not occurred, an increase of the parasitic resistance can be suppressed.

What is claimed is:

1. A method of manufacturing a semiconductor device comprising:

forming a gate insulation film on a semiconductor substrate in which element separation regions are formed;

depositing a gate lower layer material on the semiconductor substrate via the gate insulation film;

depositing a gate upper layer material, which comprises a material different from the gate lower layer material, on the gate lower layer material;

forming a gate comprising a gate upper layer and a gate lower layer by selectively processing the gate upper layer material and the gate lower layer material;

forming gate side walls on the side surface portions of the gate;

forming a first impurity implantation region by implanting ions into the semiconductor substrate using the gate side walls as a mask;

forming a source/drain diffusion layer from the first impurity implantation region by carrying out a thermal diffusion treatment;

removing the gate sides walls, and thereafter increasing the size of the gate upper layer in a horizontal direction with respect to the semiconductor substrate by carrying out a chemical reaction processing treatment to which the gate upper layer has a higher reaction speed than the gate lower layer;

forming a second impurity implantation region by implanting ions into the semiconductor substrate using the gate upper layer as a mask; and forming an extension region diffusion layer from the second impurity implantation region by carrying out a thermal diffusion treatment.

2. A method of manufacturing a semiconductor device according to claim 1, further comprises:

exposing the upper surface of the gate lower layer by removing the gate upper layer;

forming gate side wall insulation films on both the side surface portions of the gate lower layer; and forming silicides on the exposed surface portion of the extension region diffusion layer and on the upper surface portion of the gate lower layer by carrying out a self-alignment silicidation.

3. A method of manufacturing a semiconductor device according to claim 1, wherein the reaction speed of the gate upper layer in the chemical reaction processing treatment is higher than the reaction speed of the semiconductor substrate.

4. A method of manufacturing a semiconductor device according to claim 1, wherein the gate upper layer comprises any of tungsten (W), titanium (Ti), zirconium (Zr), hafnium (Hf), tantalum (Ta), and nitrides of them.

5. A method of manufacturing a semiconductor device according to claim 4, wherein the semiconductor substrate and the gate lower layer comprise silicon (Si).

6. A method of manufacturing a semiconductor device according to claim 1, wherein the chemical reaction processing treatment is an oxidizing reaction processing treatment.

7. A method of manufacturing a semiconductor device according to claim 6, wherein the gate upper layer comprises a material that can be oxidized at a temperature lower than the gate lower layer.

8. A method of manufacturing a semiconductor device according to claim 6, wherein the oxidizing reaction processing treatment is a thermal oxidation treatment carried out in an oxidizing atmosphere by setting a temperature condition to 600° C. or less.

9. A method of manufacturing a semiconductor device according to claim 8, wherein the oxidizing reaction processing treatment is a thermal oxidation treatment carried out in an oxidizing atmosphere by setting a temperature condition to 400° C. to 600° C.

* * * * *